United States Patent
Asai et al.

(10) Patent No.: US 9,012,111 B2
(45) Date of Patent: Apr. 21, 2015

(54) PHOTO-CURABLE RESIN COMPOSITION, PHOTO-CURABLE DRY FILM, PATTERNING PROCESS, PROTECTIVE FILM, AND ELECTRIC/ELECTRONIC PART

(71) Applicant: Shin-Etsu Chemical Co., Ltd., Tokyo (JP)

(72) Inventors: Satoshi Asai, Annaka (JP); Kyoko Soga, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/906,448

(22) Filed: May 31, 2013

(65) Prior Publication Data

US 2013/0323631 A1    Dec. 5, 2013

(30) Foreign Application Priority Data

Jun. 1, 2012  (JP) ................................. 2012-125756

(51) Int. Cl.
*G03F 7/038* (2006.01)
*G03F 7/004* (2006.01)

(52) U.S. Cl.
CPC .................................. *G03F 7/0041* (2013.01)

(58) Field of Classification Search
None
See application file for complete search history.

(56) References Cited

U.S. PATENT DOCUMENTS

| 6,590,010 B2 | 7/2003 | Kato et al. | |
| 7,785,766 B2 | 8/2010 | Kato et al. | |
| 2011/0076465 A1* | 3/2011 | Takeda et al. | 428/195.1 |
| 2013/0108961 A1* | 5/2013 | Oonishi et al. | 430/280.1 |
| 2013/0149493 A1* | 6/2013 | Takemura et al. | 428/138 |

FOREIGN PATENT DOCUMENTS

| JP | 10-62991 A | 3/1998 |
| JP | 2001-272784 A | 10/2001 |
| JP | 2002-88158 A | 3/2002 |
| JP | 2008-26660 A | 2/2008 |
| JP | 2008-184571 A | 8/2008 |
| WO | WO 2012/008472 A1 * | 1/2012 |

* cited by examiner

*Primary Examiner* — John A. McPherson
(74) *Attorney, Agent, or Firm* — Birch, Stewart, Kolsach & Birch, LLP

(57) ABSTRACT

A photo-curable resin composition comprising an epoxy-containing polymer, a photoacid generator in the form of an onium salt having tetrakis(pentafluorophenyl)borate anion, a solvent, and optionally an epoxy resin crosslinker forms a coating which serves as a protective film for the protection of electric/electronic parts.

15 Claims, 1 Drawing Sheet

100 μm
80 μm
60 μm
40 μm
20 μm
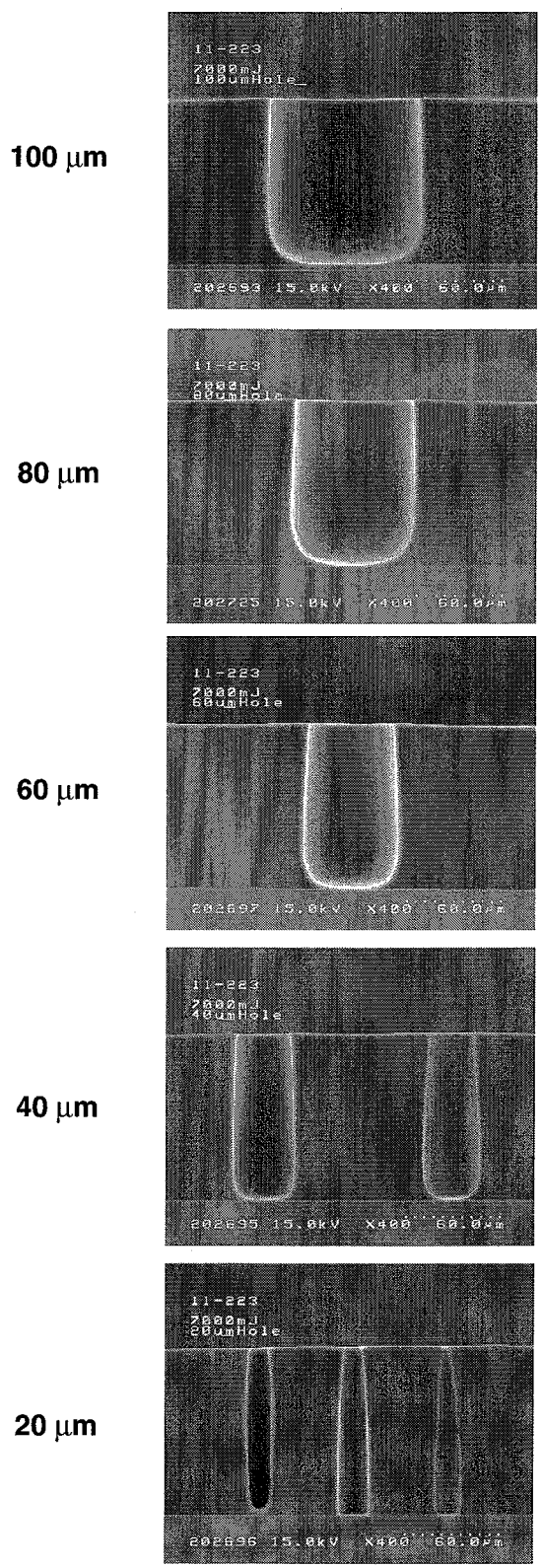

PHOTO-CURABLE RESIN COMPOSITION, PHOTO-CURABLE DRY FILM, PATTERNING PROCESS, PROTECTIVE FILM, AND ELECTRIC/ELECTRONIC PART

CROSS-REFERENCE TO RELATED APPLICATION

This non-provisional application claims priority under 35 U.S.C. §119(a) on Patent Application No. 2012-125756 filed in Japan on Jun. 1, 2012, the entire contents of which are hereby incorporated by reference.

TECHNICAL FIELD

This invention relates to a photo-curable resin composition comprising an epoxy-containing polymer and a photoacid generator, a photo-curable dry film thereof, a patterning process using the same, a film of the composition for the protection of electric/electronic parts such as substrates, circuit boards and interconnections, and an electric/electronic part. In particular, by virtue of its heat resistance, chemical resistance, insulation, and flexibility, the protective film is useful as dielectric film for semiconductor devices inclusive of re-wiring purposes, dielectric film for multilayer printed wiring boards, solder mask, isolation film for through-silicon-vias (TSVs), and cover-lay film, and in substrate laminating applications.

BACKGROUND ART

Prior art protective films for semiconductor devices and dielectric films for multilayer printed wiring boards utilize photosensitive polyimide, epoxy and silicone resin compositions. While many photosensitive materials are known for the protection of such substrates and wiring boards, JP-A 2002-088158 proposes a photosensitive silicone composition having the advantage of flexibility. Although this photosensitive silicone composition cures at low temperature to form a film which is reliable due to improved moisture-resistant adhesion, it has poor chemical resistance in photoresist strippers having a high dissolving power such as N-methyl-2-pyrrolidone.

JP-A 2008-184571 discloses a photosensitive silicone composition based on a silphenylene structure-bearing silicone polymer. Although this photosensitive silicone composition has improved chemical resistance in liquid photoresist strippers, it is desired to have more chemical resistance in solder flux fluid and higher reliability as the semiconductor device protective film.

On the other hand, JP-A 2008-026660 proposes a photosensitive resin composition comprising, in combination, a polyfunctional epoxy resin, a phenolic curing agent, and a photoacid generator in the form of a phosphate anion-containing sulfonium salt. This resin composition can form a pattern having a high aspect ratio, but suffers from a substantial internal stress. It is desired to tailor the resin composition to be more flexible.

In the thick film substrate application using a resist film of at least 100 μm thick, a patterning process which avoids outgassing of methanol or the like as induced on use of methylol based crosslinkers is required in order to form a pattern, especially contact hole pattern, having a high sensitivity and high aspect ratio.

CITATION LIST

Patent Document 1: JP-A 2002-088158
Patent Document 2: JP-A 2008-184571 (U.S. Pat. No. 7,785,766)
Patent Document 3: JP-A 2008-026660
Patent Document 4: JP-A 2001-272784
Patent Document 5: JP-A H10-062991

DISCLOSURE OF INVENTION

An object of the invention is to provide a photo-curable resin composition that forms a thick film which can be processed to define a fine feature size pattern, especially contact hole pattern, and post-cured at low temperature into a cured film having improved characteristics, especially adhesion to substrates such as circuit boards, the cured film having good reliability as a protective film for electric/electronic parts and chemical resistance in solder flux fluid. Another object is to provide a patterning process using the composition, a protective film of the composition for the protection of electric/electronic parts, and an electric/electronic part comprising the protective film.

The inventors have found that a photo-curable resin composition comprising an epoxy-containing polymer comprising recurring units of the general formula (1), shown below, and having a weight average molecular weight of 3,000 to 500,000, a photoacid generator in the form of an onium salt having tetrakis(pentafluorophenyl)borate anion of the general formula (4), shown below, a solvent, and optionally an epoxy resin crosslinker forms a coating which effectively serves as a protective film for the protection of electric/electronic parts. In particular, the photoacid generator of formula (4) is free of any toxic element such as As or Sb, performs to at least an equivalent extent to $SbF_6^-$ salts (see Patent Documents 4 and 5), and is decomposed with radiation of wavelength 190 to 500 nm to generate an acid. The photo-curable resin composition forms a coating having a substantial thickness which can be processed into a pattern, especially contact hole pattern, having fine size features and improved perpendicularity.

A cured film obtained from the photo-curable resin composition or from a curable dry film of the composition by a patterning process has improved properties including substrate adhesion, heat resistance, electrical insulation, reliability (when the film is used as dielectric protective film), chemical resistance in solder flux fluid (when the film is used as solder mask), and amenability to the substrate lamination application.

In a first aspect, the invention provides a photo-curable resin composition comprising (A) an epoxy-containing polymer comprising recurring units of the general formula (1) and having a weight average molecular weight of 3,000 to 500,000,

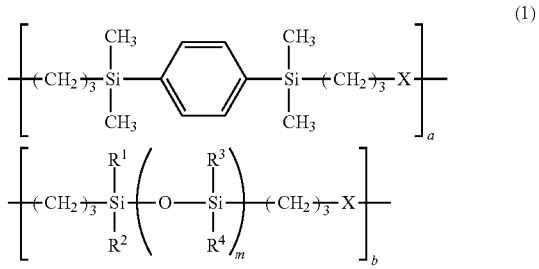

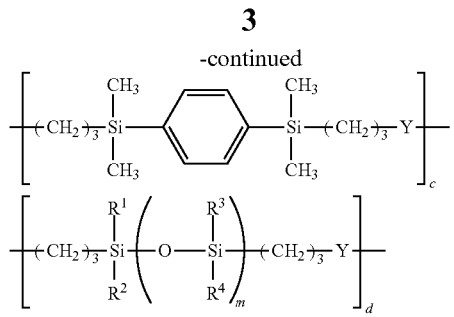

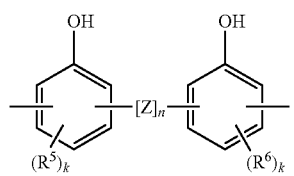

wherein $R^1$ to $R^4$ are each independently a monovalent $C_1$-$C_8$ hydrocarbon group, m is an integer of 1 to 100, a, b, c and d each are 0 or a positive number, c and d are not equal to 0 at the same time, $a+b+c+d=1$, and $0<(c+d)/(a+b+c+d)\leq1.0$, X is a divalent organic group of the general formula (2), and Y is a divalent organic group of the general formula (3),

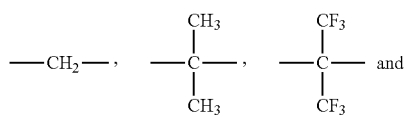
(2)

wherein Z is a divalent organic group selected from the following:

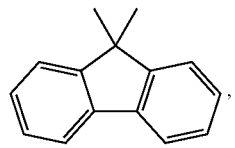

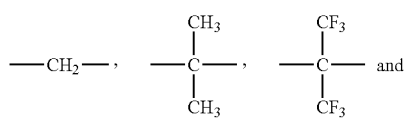

n is 0 or 1, $R^5$ and $R^6$ are each independently a $C_1$-$C_4$ alkyl or alkoxy group, k is independently 0, 1 or 2,

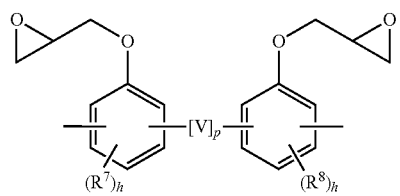
(3)

wherein V is a divalent organic group selected from the following:

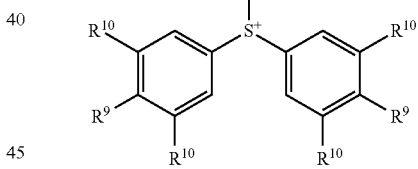

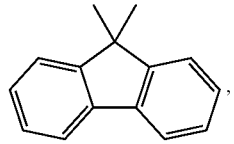

p is 0 or 1, $R^7$ and $R^8$ are each independently a $C_1$-$C_4$ alkyl or alkoxy group, and h is independently 0, 1 or 2, (B) a photoacid generator of the general formula (4) which is decomposed with radiation of wavelength 190 to 500 nm to generate an acid, (4)

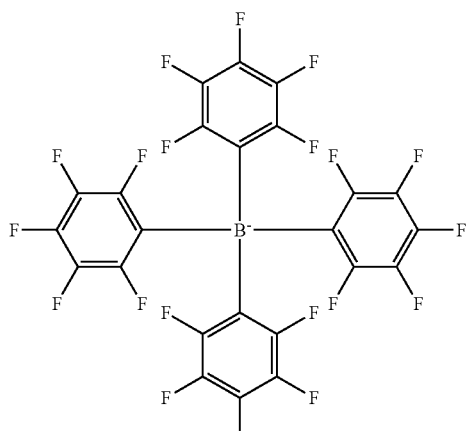

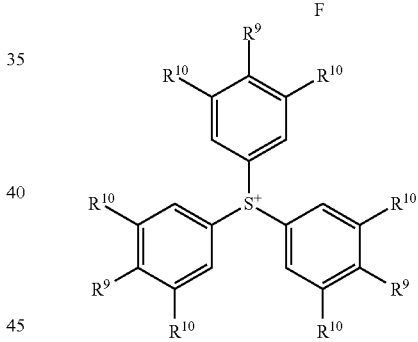

wherein $R^9$ and $R^{10}$ are each independently hydrogen, or a straight, branched or cyclic $C_1$-$C_{12}$ alkyl or alkoxy group, $C_6$-$C_{12}$ aryl, aryloxy or alkoxyaryl group, or $C_7$-$C_{12}$ aralkyl group, which may have an oxygen and/or sulfur-containing substituent group, and (C) a solvent.

In a preferred embodiment, the composition further comprises (D) an epoxy compound containing on average at least two epoxy groups per molecule other than component (A) as crosslinker and/or (E) a basic compound.

Preferably, the epoxy-containing polymer comprises units of formula (1) wherein $0<c/(a+b+c+d)\leq0.7$ and/or $0<d/(a+b+c+d)\leq0.7$.

Preferably, the photoacid generator of formula (4) is at least one member selected from the following structural formulae (4-1) to (4-4).

(4-1)
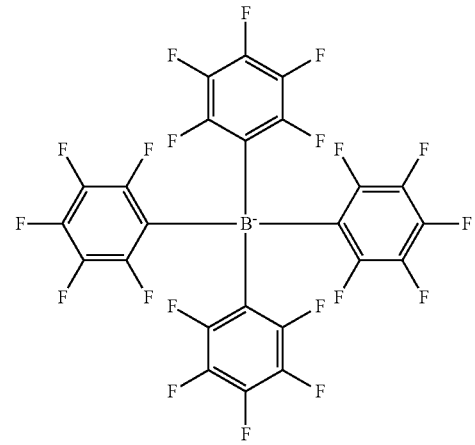
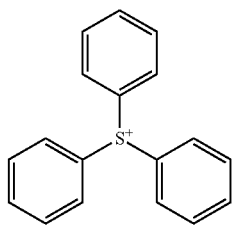
(4-3)
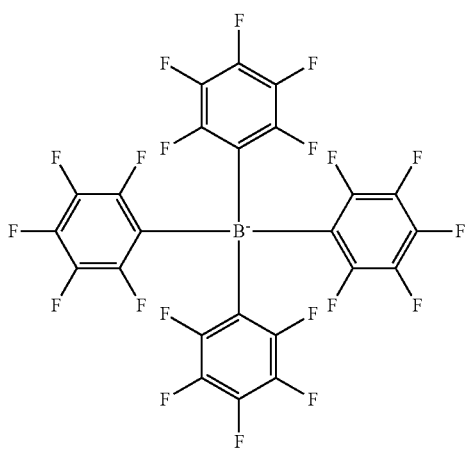
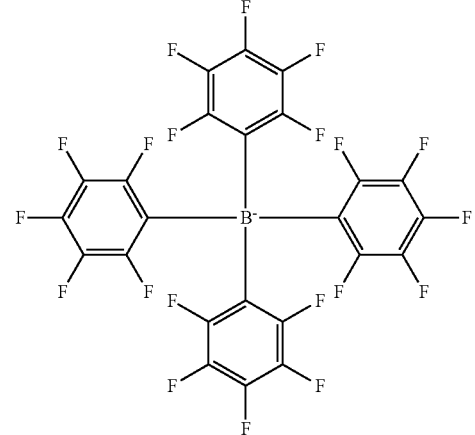
(4-2)
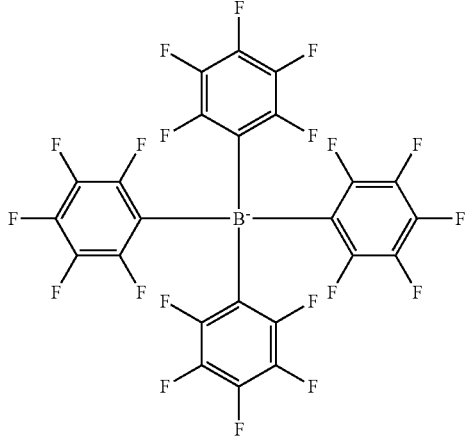
(4-4)

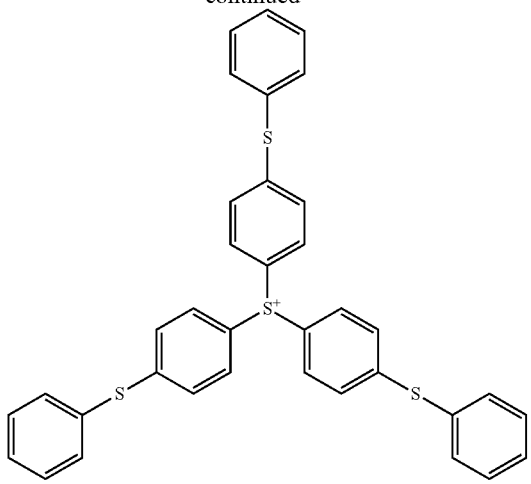

The preferred photoacid generator of formula (4) has the structural formula (4-1) or (4-4).

In a second aspect, the invention provides a photo-curable dry film obtained by coating and drying the photo-curable resin composition defined above to a support film.

In a third aspect, the invention provides a pattern forming process comprising the steps of (i) applying the photo-curable resin composition defined above or the photo-curable dry film defined above to a substrate to form a photo-curable resin layer thereon, (ii) exposing the photo-curable resin layer to radiation of wavelength 190 to 500 nm through a photomask, (iii) baking the exposed resin layer and developing it in a developer, and optionally, (iv) post-curing the patterned resin layer at a temperature of 100 to 250° C.

In a fourth aspect, the invention provides a film for the protection of electric and electronic parts, which is the cured layer obtained by the above process.

In a fifth aspect, the invention provides an electric or electronic part comprising the protective film.

Advantageous Effects of Invention

In the photo-curable resin composition comprising an epoxy-containing polymer and a photoacid generator in the form of an onium salt having tetrakis(pentafluorophenyl)borate anion, crosslinking takes place between epoxy groups on the epoxy-containing polymer even in the absence of an epoxy base crosslinker. The composition is coatable as a thick film specifically having a thickness of at least 100 from which a fine size pattern can be formed. The resin composition having crosslink form of negative resist can form a pattern at a very high sensitivity, as compared with the use of methylol base crosslinker. Besides, the pattern is fully perpendicular.

After pattern formation by photo-imaging, the photo-curable resin composition is heat treated at a relatively low temperature of up to 250° C. The resulting patterned film has improved properties including adhesion to substrates such as electronic parts, semiconductor chips and circuit boards, mechanical properties, electrical insulation, reliability as dielectric protective film, crack resistance as protective film, and chemical resistance in solder flux fluid as solder mask. The composition is advantageously used in forming protective films for electric and electronic parts including circuit boards, semiconductor chips and display devices and amenable to the substrate lamination application.

BRIEF DESCRIPTION OF DRAWINGS

The only FIGURE, FIG. 1 is a set of SEM images in cross section of 100, 80, 60, 40 and 20-μm contact hole patterns in Example 10.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. The terms "coating", "layer" and "film" are interchangeable.

The acronym "PAG" stands for photoacid generator, "PEB" for post-exposure bake, "Mw" for weight average molecular weight, and "GPC" for gel permeation chromatography.

One embodiment of the invention is a photo-curable resin composition comprising components (A), (B) and (C). Component (A) is an epoxy-containing polymer comprising recurring units of the general formula (1) and having a weight average molecular weight (Mw) of 3,000 to 500,000.

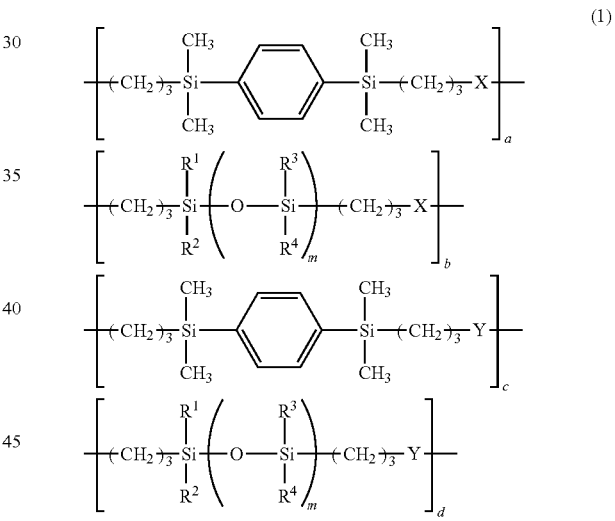

Herein each of $R^1$ to $R^4$, which may be the same or different, stands for a monovalent hydrocarbon group having 1 to 8 carbon atoms, and preferably 1 to 6 carbon atoms. Examples include straight, branched or cyclic alkyl groups such as methyl, ethyl, propyl, isopropyl, n-butyl, tert-butyl, and cyclohexyl, straight, branched or cyclic alkenyl groups such as vinyl, allyl, propenyl, butenyl, hexenyl, and cyclohexenyl, aryl groups such as phenyl and tolyl, and aralkyl groups such as benzyl and phenylethyl.

From the standpoints of compatibility with a crosslinking agent and a photoacid generator to be described later and photo-curability, m is an integer of 1 to 100, preferably 1 to 80. From the standpoints of substrate adhesion, electrical properties, and reliability, a, b, c and d each are 0 or a positive number, with the proviso that c and d are not equal to 0 at the same time, a+b+c+d=1, and these subscripts satisfy the range: $0<(c+d)/(a+b+c+d)\leq 1.0$, preferably $0.05\leq (c+d)/(a+b+c+d)\leq 0.9$, and more preferably $0.08\leq (c+d)/(a+b+c+d)\leq 0.8$.

Desirably, a, b, c and d satisfy the ranges: $0 \leq a < 1$, more desirably $0.05 \leq a \leq 0.9$, $0 \leq b < 1$, more desirably $0.05 \leq b \leq 0.9$, $0 < c < 1$, more desirably $0 < c \leq 0.7$, and $0 < d < 1$, more desirably $0 < d \leq 0.7$.

X is a divalent organic group of the general formula (2). Y is a divalent organic group of the general formula (3). It is noted that component (A) contains at least one divalent organic group of formula (3).

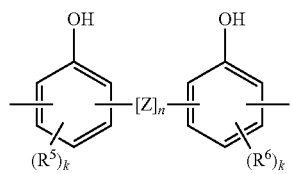
(2)

Herein Z is a divalent organic radical selected from the following:

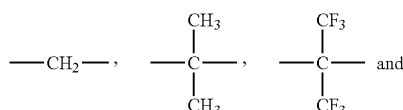

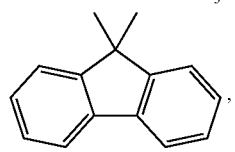

n is 0 or 1, each of $R^5$ and $R^6$ which may be the same or different is a $C_1$-$C_4$ alkyl or alkoxy group, and k is independently 0, 1 or 2. Examples of $R^5$ and $R^6$ include methyl, ethyl, isopropyl, tert-butyl, methoxy, ethoxy, and isopropyloxy.

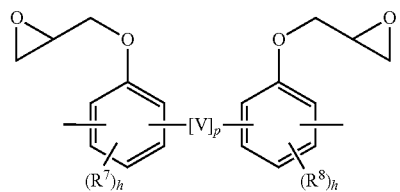
(3)

Herein V is a divalent organic radical selected from the following:

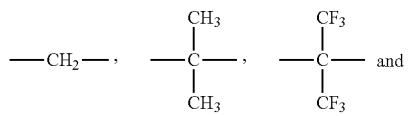

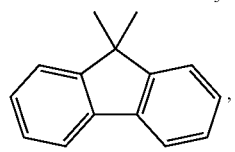

p is 0 or 1, each of $R^7$ and $R^8$ which may be the same or different is a $C_1$-$C_4$ alkyl or alkoxy group, and h is independently 0, 1 or 2. Examples of $R^7$ and $R^8$ are as exemplified for $R^5$ and $R^6$.

The epoxy-containing polymer should have a Mw of 3,000 to 500,000 and preferably 5,000 to 300,000, from the standpoints of compatibility and photo-curability of a composition comprising the polymer as well as mechanical properties of the cured composition. It is noted that Mw is determined by gel permeation chromatography (GPC) versus polystyrene standards.

Component (B) is a photoacid generator which is decomposed with radiation of wavelength 190 to 500 nm to generate an acid. It is an onium salt having tetrakis(pentafluorophenyl)borate anion, represented by the general formula (4).

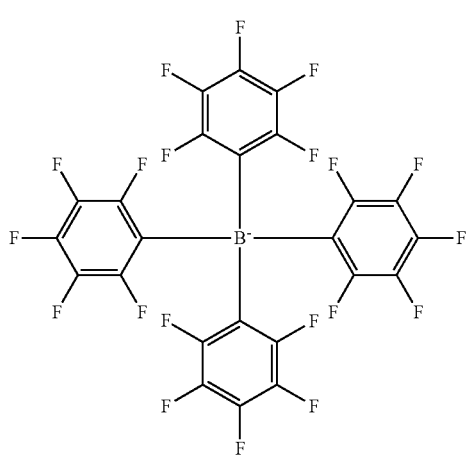
(4)

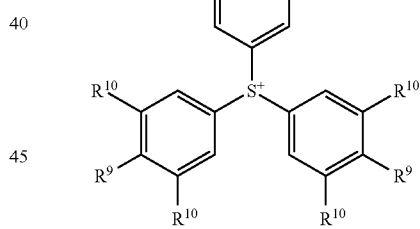

Herein $R^9$ and $R^{10}$ are each independently hydrogen, or a straight, branched or cyclic $C_1$-$C_{12}$ alkyl or alkoxy group, $C_6$-$C_{12}$ aryl, aryloxy or alkoxyaryl group, or $C_7$-$C_{12}$ aralkyl group, which may have an oxygen atom and/or sulfur atom-containing substituent group.

Of the groups represented by $R^9$ and $R^{10}$, suitable alkyl groups include methyl, ethyl, propyl, isopropyl, n-butyl, tert-butyl, cyclohexyl, norbornyl, and adamantyl. Suitable alkoxy groups include methoxy, ethoxy, propoxy, and butoxy. Suitable aryl, aryloxy and alkoxyaryl groups include phenyl; phenyloxy; alkoxyphenyl groups such as o-, m- or p-methoxyphenyl, ethoxyphenyl, m- or p-tert-butoxyphenyl; and alkylphenyl groups such as 2-, 3- or 4-methylphenyl, ethylphenyl, 4-tert-butylphenyl, 4-butylphenyl, and dimethylphenyl. Suitable aralkyl groups include benzyl and phenethyl. Suitable oxygen and/or sulfur-containing substituent groups include methoxy, ethoxy, phenyloxy, p-acetoxyphenyloxy, methylthio, ethylthio, phenylthio, p-methoxyphenylthio, p-acetylphenylthio, and p-acetoxyphenylthio.

Preferably $R^9$ is hydrogen. Also preferably $R^{10}$ is hydrogen, methoxy, phenylthio, p-acetylphenylthio or p-acetoxyphenylthio group, with phenylthio and p-acetylphenylthio being more preferred.

From the standpoint of photo-acid generation ability, component (B) contains typically at least 80 mol %, preferably at least 90 mol %, and most preferably 100 mol % of tetrakis(pentafluorophenyl)borate anion. Besides the borate anion, component (B) may contain another anion which is to form any well-known photoacid generator.

Specific examples of the PAG having tetrakis(pentafluorophenyl)borate anion, represented by formula (4), include compounds of the general formulae (4-1) to (4-4).

(4-1)
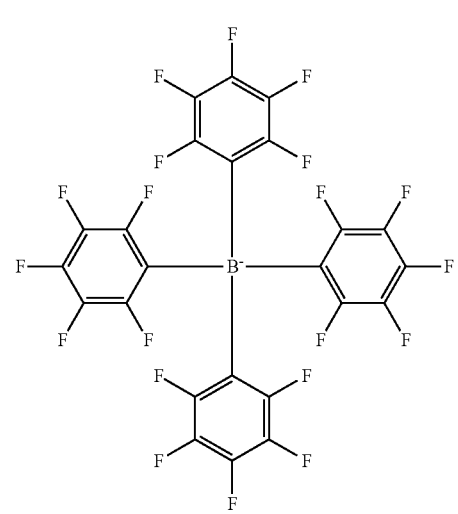

(4-2)
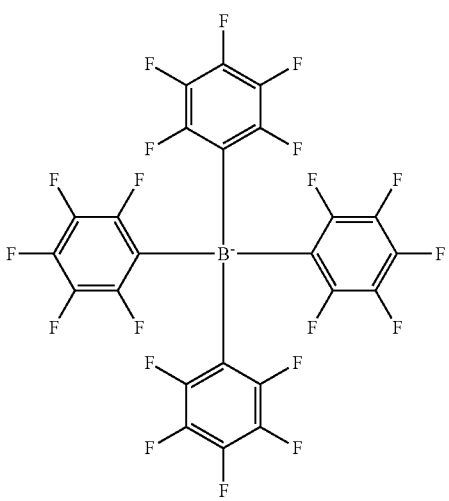

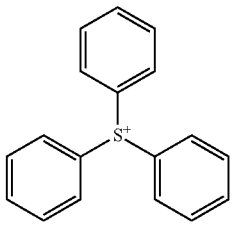

(4-3)
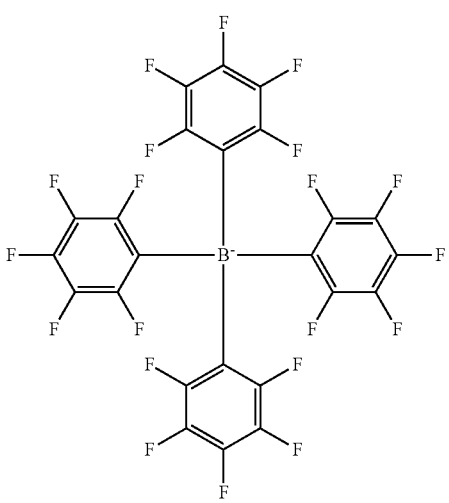

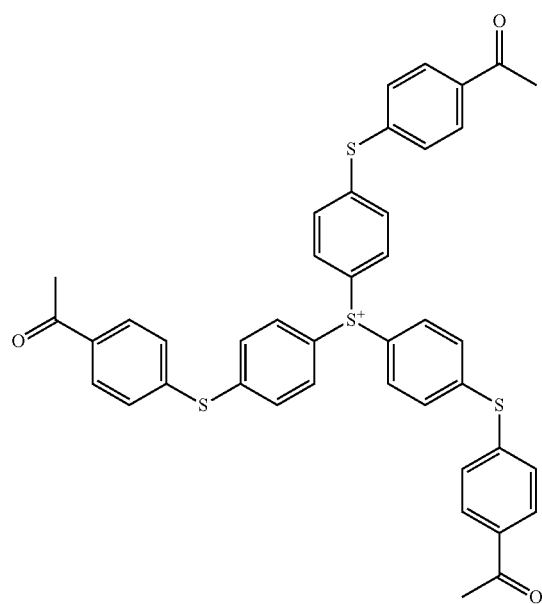

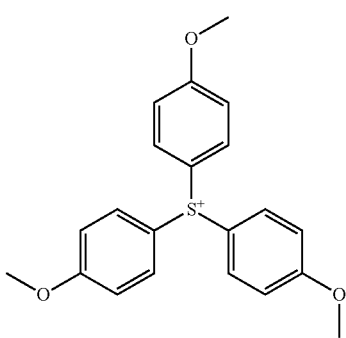

-continued (4-4)

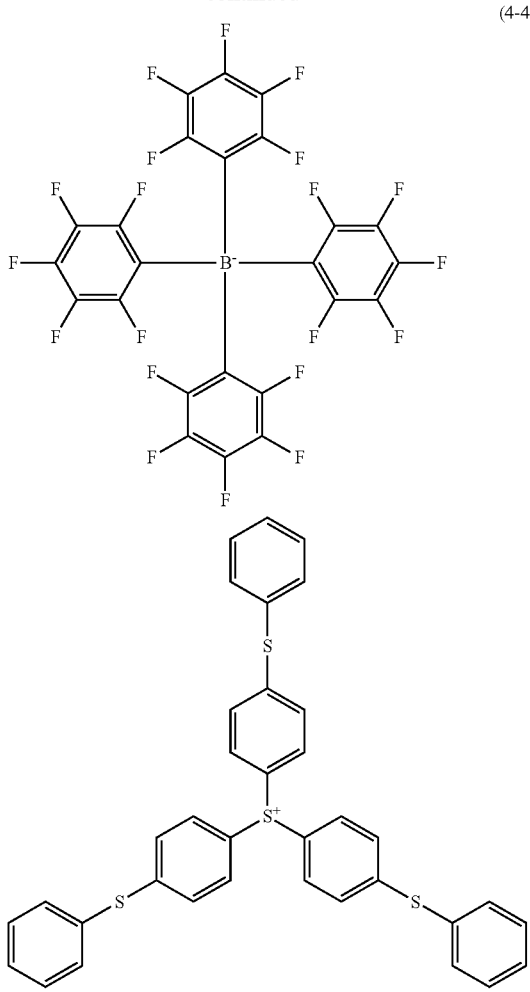

The PAGs may be used alone or in admixture of two or more. It is preferred from the standpoint of photo-curability to add the PAG in an amount of 0.01 to 20 parts by weight, and more preferably 0.05 to 5 parts by weight, per 100 parts by weight of the epoxy-containing polymer. Outside the range, a less amount of PAG may generate an insufficient amount of acid to achieve an acceptable sensitivity. An extra amount of PAG may not be dissolved in solvent, giving rise to problems including degraded resolution and foreign particles formed upon development and resist stripping.

Component (C) is a solvent. The solvent used herein may be selected from those solvents in which the epoxy-containing polymer (A), photoacid generator (B), crosslinker, basic compound and other additives (to be described later) are soluble. Typically organic solvents are used as these components are fully soluble therein.

Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in combinations of two or more thereof. Of these solvents, preferred are ethyl lactate, cyclohexanone, cyclopentanone, PGMEA, γ-butyrolactone, and mixtures thereof, in which the PAG is most soluble.

An appropriate amount of the solvent (C) used is 30 to 2,000 parts, and especially 40 to 1,000 parts by weight per 100 parts by weight of components (A) and (B) combined, when determined from the standpoints of compatibility and viscosity of the photo-curable resin composition.

In a preferred embodiment, the photo-curable resin composition may further comprise (D) a crosslinker. It is an epoxy compound containing on average at least two epoxy groups per molecule other than component (A). The crosslinker induces curing reaction with the epoxy-containing polymer for facilitating pattern formation and augmenting the strength of a cured product. The crosslinker should preferably have a Mw of 150 to 10,000, and more preferably 200 to 3,000, from the standpoints of photo-curability and heat resistance.

Suitable examples of the crosslinker include bisphenol epoxy resins such as bisphenol A epoxy resin and bisphenol F epoxy resin, novolak epoxy resins such as phenol novolak epoxy resin and cresol novolak epoxy resin, triphenol alkane epoxy resins and polymers thereof, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, alicyclic epoxy resins, and heterocyclic epoxy resins. Of these, bisphenol epoxy resins and novolak epoxy resins are preferred.

The crosslinkers may be used alone or in admixture of two or more. An appropriate amount of the crosslinker used is 0.5 to 50 parts, and especially 1 to 30 parts by weight per 100 parts by weight of the epoxy-containing polymer, when determined from the standpoints of flexibility, chemical resistance and substrate adhesion. An excessive amount of crosslinker may prevent a cured film from exerting the desired properties.

In the photo-curable resin composition, a basic compound may be compounded as component (E). The basic compound used herein is preferably a compound capable of suppressing the rate of diffusion when the acid generated by the PAG diffuses within the photo-curable resin layer. The inclusion of the basic compound contributes to an improvement in resolution, suppresses changes in sensitivity following exposure, and reduces substrate and environment dependence, as well as improving the exposure latitude and the pattern profile.

Suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, triethanolamine, t-butyldiethanolamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate.

Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the general formula (5) may also be added.

$$N(\alpha)_e(\beta)_{3-e} \tag{5}$$

In formula (5), e is equal to 1, 2 or 3; side chain β is independently hydrogen or a straight, branched or cyclic $C_1$-$C_{20}$ alkyl group which may contain an ether bond or hydroxyl group; and side chain α is independently selected from groups of the following general formulas (6) to (8), and two or three α's may bond together to form a ring.

$$-[R^{300}-O-R^{301}] \tag{6}$$

$$-[R^{302}-O-R^{303}-\overset{O}{\underset{\|}{C}}-R^{304}] \tag{7}$$

$$-[R^{305}-\overset{O}{\underset{\|}{C}}-O-R^{306}] \tag{8}$$

In the formulas, $R^{300}$, $R^{302}$ and $R^{305}$ are each independently a straight or branched $C_1$-$C_4$ alkylene group. $R^{301}$ and $R^{304}$ are each independently hydrogen, or a straight, branched or cyclic $C_1$-$C_{20}$ alkyl group which may contain at least one hydroxyl radical, ether bond, ester bond or lactone ring. $R^{303}$ is a single bond or a straight or branched $C_1$-$C_4$ alkylene group. $R^{306}$ is a straight, branched or cyclic $C_1$-$C_{20}$ alkyl group, which may contain at least one hydroxyl radical, ether bond, ester bond or lactone ring.

Illustrative examples of the compounds of formula (5) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-

(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compounds may be used alone or in admixture of two or more. The basic compound is preferably formulated in an amount of 0 to 3 parts, and more preferably 0.01 to 1 part by weight per 100 parts by weight of the epoxy-containing polymer, when determined from the standpoint of sensitivity.

In addition to the aforementioned components, the photo-curable resin composition may include optional additives. Suitable additives include a surfactant which is commonly used for improving the coating characteristics, a light absorber which is used for improving light absorption efficiency of PAG, and the like.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad FC-4430 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from DIC Corp., and X-70-093 from Shin-Etsu Chemical Co., Ltd. Preferred surfactants include Fluorad FC-4430 from Sumitomo 3M Ltd. and X-70-093 from Shin-Etsu Chemical Co., Ltd.

Exemplary light absorbers include diaryl sulfoxides, diaryl sulfones, 9,10-dimethylanthracene and 9-fluorenone.

The photo-curable resin composition of the invention is prepared in a conventional way. For example, it can be prepared by agitating and mixing the aforementioned components and optional additives in the solvent and passing the mixture through a filter to remove solid impurities, if necessary.

The photo-curable resin composition thus prepared is useful as protective films for semiconductor devices, protective films on interconnections, cover-lay films, and solder masks. It can also be applied to electrical and electronic parts, for example, as a dielectric film for TSVs.

Pattern Forming Process

When a pattern is formed using the photo-curable resin composition, the patterning process involves the steps of (i) applying the photo-curable resin composition to a substrate to form a photo-curable resin layer or coating thereon, (ii) exposing the layer to radiation having a wavelength of 190 to 500 nm through a photomask, (iii) post-exposure baking (PEB) and developing the exposed layer in a developer. After the layer or coating is patterned through these steps, the step (iv) of heating the patterned coating is performed for post-curing purpose, eventually yielding the desired film suitable for the protection of electric or electronic parts.

More particularly, the photo-curable resin composition is first (i) applied onto a substrate to form a photo-curable resin layer or coating thereon. The substrates used herein include silicon wafers, TSV silicon wafers, and plastic or ceramic circuit substrates. Also useful is a substrate having a metal (e.g., Cu, Ni or Au) deposited partially or entirely on its surface by ion sputtering or plating.

Any well-known techniques complying with lithography may be used to apply the composition. For example, the composition is applied by dipping, spin coating or roll coating. The coverage may be determined as appropriate for a particular purpose although a coating weight sufficient to form a photo-curable resin layer of 0.1 to 200 µm thick is often preferred. Preferably the photo-curable resin layer has a thickness of 1 to 180 µm, more preferably 3 to 150 µm.

In order that effective photo-curing reaction take place, the solvent may be previously evaporated off by preheating or prebaking, if necessary. The prebaking is, for example, at 40 to 140° C. for 1 minute to 1 hour.

The coating is then (ii) exposed to radiation having a wavelength of 190 to 500 nm through a photomask for effecting photo-curing reaction. The photomask used herein may be a member in which a desired pattern has been cut out. The photomask is preferably made of a material capable of shielding the radiation of wavelength 190 to 500 nm, for example, chromium although the photomask material is not limited thereto. Examples of the radiation of wavelength 190 to 500 nm include radiation of various wavelengths generated by radiation-emitting units, for example, UV radiation (e.g., g, h and i-line) and deep UV radiation (248 nm, 198 nm). A wavelength range from 248 to 436 nm is preferred. An appropriate exposure dose is 10 to 3,000 mJ/cm$^2$.

If desired for increasing the development sensitivity, the exposed coating (or layer) may be heat treated (iii). Such post-exposure baking (PEB) is effected, for example, at 40 to 140° C. for 0.5 to 10 minutes.

Following the exposure and PEB, the coating (or layer) is developed in a developer. The developer is preferably any of customarily used organic solvents, for example, alcohols such as isopropyl alcohol (IPA), ketones such as cyclohexanone, glycols such as propylene glycol monomethyl ether, and esters such as PGMEA. The solvent which may be used as the solvent for the photo-curable resin composition can be used at the development stage. Development is effected in a conventional manner, for example, by dipping the pattern-bearing substrate in the developer. The development is followed by washing, rinsing and drying if necessary. There is obtained a coating or film of photo-curable resin composition having the desired pattern. As a result of development, the unexposed area of film is dissolved away while the area of film which has been crosslinked via exposure is left as a pattern.

Although the pattern forming process has been described, it is sometimes unnecessary to form a pattern. When it is simply desired to form a uniform film, for example, the same process as above may be followed except that the resin layer is exposed to radiation of wavelength 190 to 500 nm (flood exposure without photomask).

If desired, the patterned coating may be post-cured (iv) by heating in an oven or on a hot plate at a temperature of 100 to 250° C., preferably 150 to 220° C. Post-curing at 100 to 250° C. is effective for increasing the crosslinking density of the coating and removing the residual volatile matter. The resulting coating has augmented adhesion to substrates, heat resistance, high strength and good electrical properties. The post-curing time may range from 10 minutes to 10 hours.

Since the cured coating (or film) obtained from the photo-curable resin composition in the above-described way has heat resistance, flexibility, electrical insulation, mechanical properties, substrate adhesion, and chemical resistance in solder flux fluid, it can be advantageously used as a protective film on electric and electronic parts such as semiconductor devices.

Photo-Curable Dry Film

A further embodiment of the invention is a photo-curable dry film comprising a photo-curable resin layer sandwiched between a support film and a protective film wherein the photo-curable resin layer is formed by applying and drying the photo-curable resin composition defined above to the support film.

The photo-curable dry film is solid, and the photo-curable resin layer contains no solvent. This eliminates the risk that bubbles resulting from volatilization of solvent are left within the resin layer and between the resin layer and the rugged substrate surface. An appropriate thickness range exists for the layer when planarity and step coverage on rugged substrate surface and a substrate lamination spacing are taken into account. It is preferred from the standpoints of planarity, step coverage, and substrate lamination spacing that the photo-curable resin layer have a thickness of 5 to 300 µm, more preferably 10 to 150 µm.

Furthermore, the viscosity and fluidity of the photo-curable resin layer are closely correlated. As long as the photo-curable resin layer has a proper range of viscosity, it exhibits a sufficient fluidity to fill deeply even in a narrow gap or it softens to enhance the adhesion to the substrate. Accordingly, from the standpoint of fluidity, the photo-curable resin layer should preferably have a viscosity in the range of 10 to 5,000 Pa-s, more preferably 30 to 2,000 Pa-s, and even more preferably 50 to 300 Pa-s at a temperature of 80 to 120° C. It is noted that the viscosity is measured by a HAAKE rheometer MARS II.

The photo-curable dry film has the advantage that when tightly attached to a substrate having asperities on its surface, the photo-curable resin layer is coated so as to conform to the asperities, achieving high planarity. Particularly when the photo-curable resin layer is composed mainly of a photo-curable silicone composition as defined herein, higher planarity is achievable owing to the advantage of low surface tension. Further, if the photo-curable resin layer is in close contact with the substrate in a vacuum environment, generation of gaps therebetween is effectively inhibited.

Next, it is described how to manufacture the photo-curable dry film. An apparatus for manufacturing the photo-curable dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support film is unwound from a supply roll in the film coater, passed across the head of the film coater where the photo-curable resin composition is coated onto the support film to the predetermined buildup, and then moved through a hot air circulating oven at a predetermined temperature for a predetermined time, where the photo-curable resin layer is dried on the support film. Thereafter, the support film having the photo-curable resin layer thereon and a protective film which is unwound from another supply roll in the film coater are passed across a laminate roll under a predetermined pressure whereby the protective film is bonded to the photo-curable resin layer on the support film, whereupon the laminate is wound up on a take-up shaft in the film coater. Preferably, the oven temperature is 25 to 150° C., the time is 1 to 100 minutes, and the bonding pressure is 0.01 to 5 MPa.

The support film used in the photo-curable dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET 38×1-A3, PET38×1-V8 and PET38×1-X08 from Nippa Co., Ltd.

The protective film used in the photo-curable dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 µm, more preferably 25 to 50 µm, for consistent manufacture of photo-curable dry film, and prevention of wrapping or curling on a take-up roll.

The photo-curable dry film thus obtained may be attached to an electric or electronic part after stripping the protective film therefrom.

After the protective film is stripped off, the photo-curable dry film (i.e., photo-curable resin layer) is placed in close contact with a substrate using a film attachment apparatus. The substrate used herein may be selected from a silicon wafer, silicon wafer for TSV, silicon wafer worked in thin film form by backside polishing, plastic or ceramic substrate, and substrate having a metal (e.g., Ni or Au) deposited partially or entirely on its surface by ion sputtering or plating. A typical substrate is provided with holes or grooves having an opening width of 10 to 100 μm and a depth of 10 to 120 μm. The film attachment apparatus is preferably a vacuum laminator. The photo-curable dry film is mounted in the film attachment apparatus where the protective film is stripped from the dry film. In the vacuum chamber kept at a predetermined vacuum, the bare photo-curable resin layer of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The attachment of dry film may be repeated plural times, if necessary to obtain a photo-curable resin layer having the desired thickness. The attachment step is repeated 1 to 10 times, for example, before a photo-curable resin layer having a thickness of 10 to 1,000 μm, preferably 100 to 500 μm is obtainable.

The assembly of the photo-curable resin layer on the substrate may be prebaked, if necessary, for facilitating photo-cure reaction of the photo-curable resin layer or enhancing the adhesion between the photo-curable resin layer and the substrate. Prebake may be, for example, at 40 to 140° C. for 1 minute to 1 hour. Like the photo-curable resin composition, the photo-curable resin layer attached to the substrate may be subjected to exposure, development, and optionally substrate bonding and post-cure or heat treatment. It is noted that the support film of the photo-curable dry film may be removed before prebake or before PEB, by mechanical stripping or the like, depending on a particular process.

The cured film obtained from the photo-curable resin composition or photo-curable dry film has excellent properties including heat resistance, flexibility, electric insulation, mechanical properties, and substrate adhesion and is thus best suited as protective film for electric and electronic parts such as semiconductor devices.

EXAMPLE

Synthesis Examples, Examples and Comparative Examples are given below by way of illustration and not by way of limitation. All parts are by weight (pbw).

In Synthesis Examples below, compounds M-1 to M-5 having the chemical structure shown below were used.

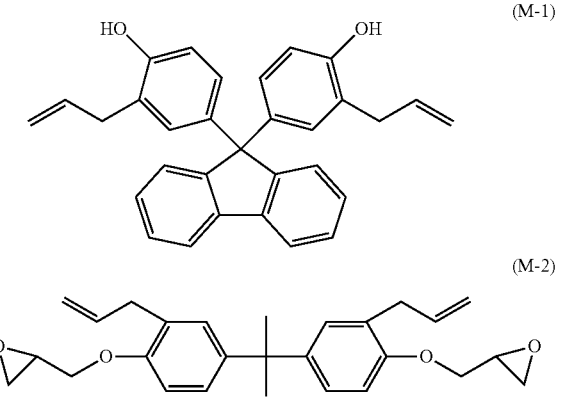

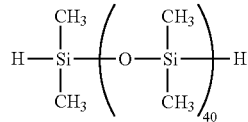

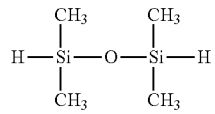

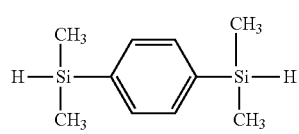

Synthesis Example 1

In a 5-L flask equipped with a stirrer, thermometer, nitrogen purging line and reflux condenser, 397.0 g of compound M-1 and 45.0 g of compound M-2 were dissolved in 1,875 g of toluene. To the solution, 949.6 g of compound M-3 and 6.1 g of compound M-4 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.5 g of compound M-5 was added dropwise over one hour. At this point, the flask internal temperature rose to 78° C. After the dropwise addition, the reaction solution was ripened for 3 hours at 90° C. and then cooled to room temperature. Then 1,700 g of methyl isobutyl ketone was added. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 950 g of cyclopentanone was added. This yielded a polymer solution (A-1) in cyclopentanone having a solids concentration of 60 wt %. The polymer in the solution was measured for molecular weight by GPC versus polystyrene standards, finding a Mw of 59,000. The polymer corresponded to formula (1) wherein molar fractions a=0.569, b=0.336, c=0.058, and d=0.037 as computed from the molar amounts of reactants charged. X and Y are shown below, and m=1 to 40.

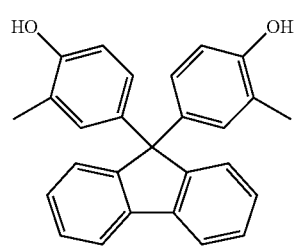

-continued

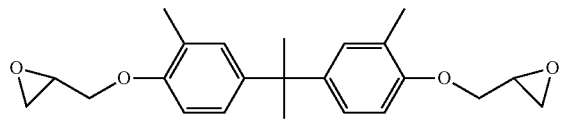

Y

Synthesis Example 2

In a 5-L flask equipped with a stirrer, thermometer, nitrogen purging line and reflux condenser, 352.6 g of compound M-1 and 89.9 g of compound M-2 were dissolved in 1,875 g of toluene. To the solution, 949.6 g of compound M-3 and 6.1 g of compound M-4 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.0 g of compound M-5 was added dropwise over one hour. At this point, the flask internal temperature rose to 79° C. After the dropwise addition, the reaction solution was ripened for 3 hours at 90° C. and then cooled to room temperature. Then 1,700 g of methyl isobutyl ketone was added. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 980 g of cyclopentanone was added. This yielded a polymer solution (A-2) in cyclopentanone having a solids concentration of 60 wt %. The polymer in the solution was measured for molecular weight by GPC versus polystyrene standards, finding a Mw of 61,000. The polymer corresponded to formula (1) wherein molar fractions a=0.480, b=0.320, c=0.120, and d=0.080 as computed from the molar amounts of reactants charged. X, Y and m are as in Synthesis Example 1.

Synthesis Example 3

In a 5-L flask equipped with a stirrer, thermometer, nitrogen purging line and reflux condenser, 308.7 g of compound M-1 and 136.8 g of compound M-2 were dissolved in 1,875 g of toluene. To the solution, 949.6 g of compound M-3 and 6.1 g of compound M-4 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.3 g of compound M-5 was added dropwise over one hour. At this point, the flask internal temperature rose to 80° C. After the dropwise addition, the reaction solution was ripened for 3 hours at 90° C. and then cooled to room temperature. Then 1,700 g of methyl isobutyl ketone was added. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 900 g of cyclopentanone was added. This yielded a polymer solution (A-3) in cyclopentanone having a solids concentration of 60 wt %. The polymer in the solution was measured for molecular weight by GPC versus polystyrene standards, finding a Mw of 55,000. The polymer corresponded to formula (1) wherein molar fractions a=0.420, b=0.280, c=0.180, and d=0.120 as computed from the molar amounts of reactants charged. X, Y and m are as in Synthesis Example 1.

Synthesis Example 4

In a 5-L flask equipped with a stirrer, thermometer, nitrogen purging line and reflux condenser, 220.5 g of compound M-1 and 225.0 g of compound M-2 were dissolved in 1,875 g of toluene. To the solution, 949.6 g of compound M-3 and 6.1 g of compound M-4 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.3 g of compound M-5 was added dropwise over one hour. At this point, the flask internal temperature rose to 80° C. After the dropwise addition, the reaction solution was ripened for 3 hours at 90° C. and then cooled to room temperature. Then 1,700 g of methyl isobutyl ketone was added. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 950 g of cyclopentanone was added. This yielded a polymer solution (A-4) in cyclopentanone having a solids concentration of 60 wt %. The polymer in the solution was measured for molecular weight by GPC versus polystyrene standards, finding a Mw of 52,000. The polymer corresponded to formula (1) wherein molar fractions a=0.294, b=0.206, c=0.306, and d=0.194 as computed from the molar amounts of reactants charged. X, Y and m are as in Synthesis Example 1.

Synthesis Example 5

In a 5-L flask equipped with a stirrer, thermometer, nitrogen purging line and reflux condenser, 441.0 g of compound M-1 was dissolved in 1,875 g of toluene. To the solution, 949.6 g of compound M-3 and 6.1 g of compound M-4 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.3 g of compound M-5 was added dropwise over one hour. At this point, the flask internal temperature rose to 78° C. After the dropwise addition, the reaction solution was ripened for 5 hours at 90° C. and then cooled to room temperature. Then 1,700 g of methyl isobutyl ketone was added. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 950 g of cyclopentanone was added. This yielded a polymer solution (B-1) in cyclopentanone having a solids concentration of 60 wt %. The polymer in the solution was measured for molecular weight by GPC versus polystyrene standards, finding a Mw of 56,000. The polymer corresponded to formula (1) wherein molar fractions a=0.590, b=0.410, c=0, and d=0 as computed from the molar amounts of reactants charged.

Another epoxy-containing polymer used in Comparative Example 5 is multifunctional bisphenol A novolak epoxy resin EPON SU-8 (Resolution Performance Products).

The PAGs used in Examples and Comparative Examples and reported in Table 1 are identified below.

(PAG-1)

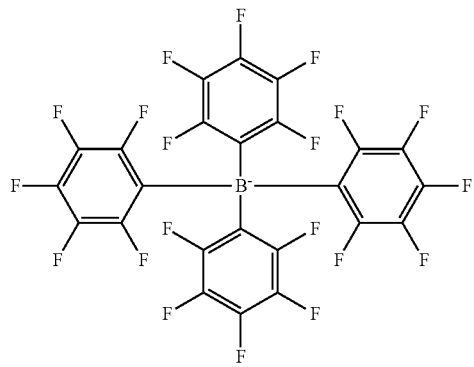

(4-2)

(PAG-2)

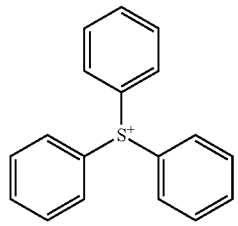

(4-3)

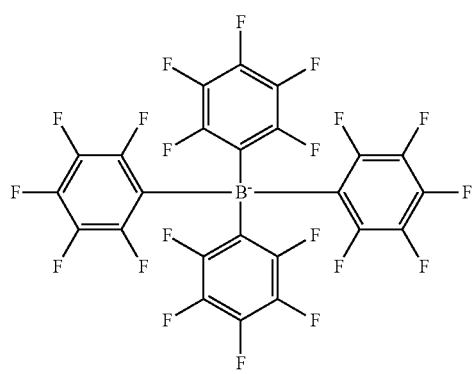

-continued

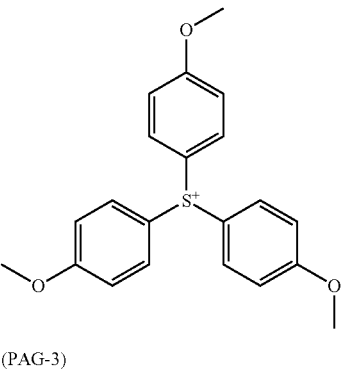

(PAG-3)

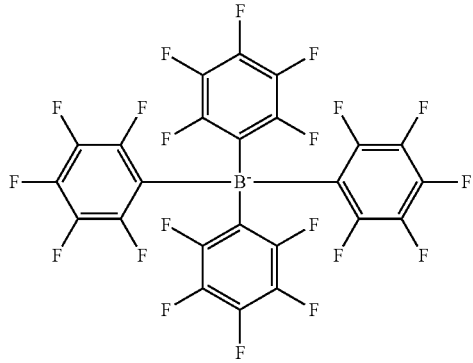

(4-4)

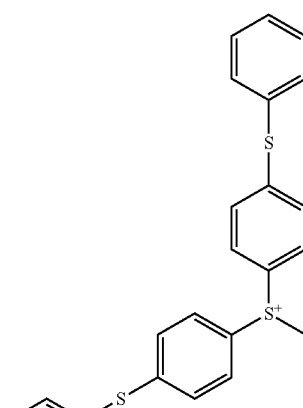

(PAG-4)

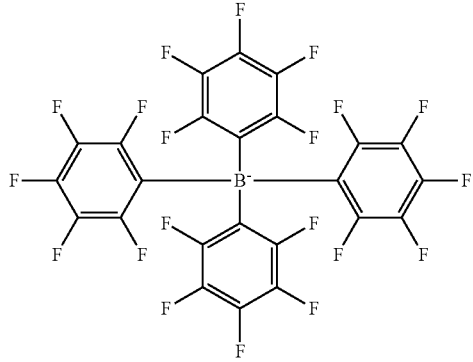

(4-1)

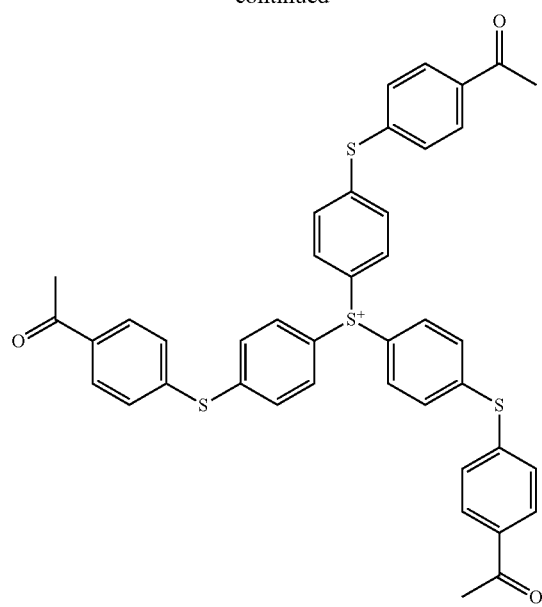

(PAG-5)

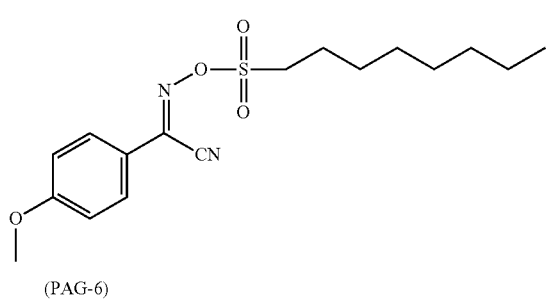

(PAG-6)

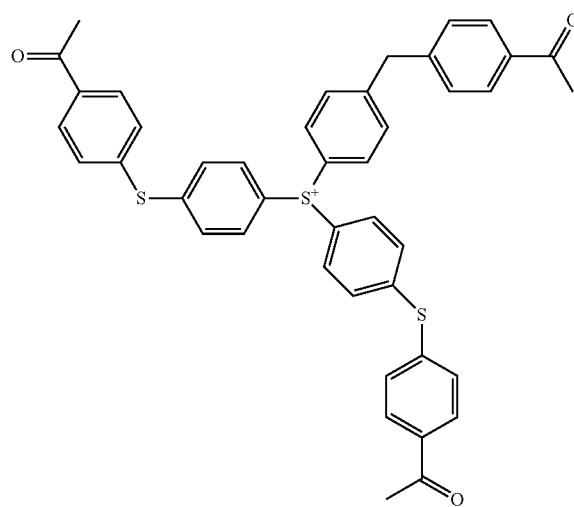

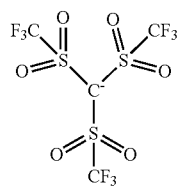

The crosslinkers used in Examples and Comparative Examples and reported in Table 1 are identified below.

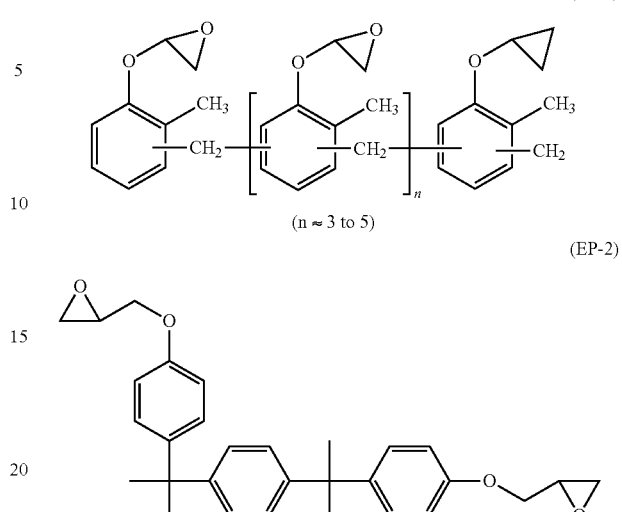

(EP-1)

(EP-2)

(EP-3)

The basic compound used in Examples and Comparative Examples and reported in Table 1 is identified below.

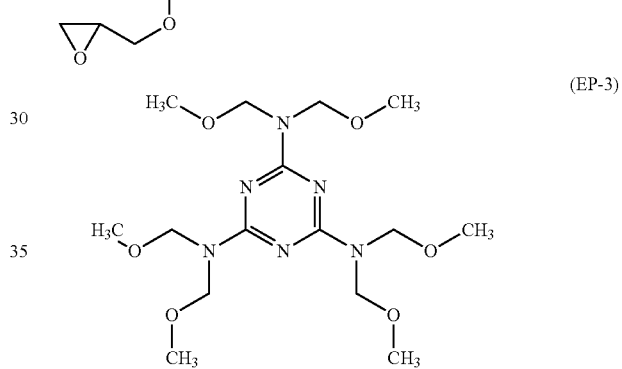

(AM-1)

Examples 1 to 17 and Comparative Examples 1 to 5

Photo-curable resin compositions were prepared by combining the epoxy-containing polymer, PAG, crosslinker, basic compound and solvent in accordance with the formulation shown in Table 1, stirring and mixing at room temperature until dissolution, and precision filtering through a Teflon® filter with a pore size of 0.2 μm.

A die coater was used as the film coater and a polyethylene terephthalate (PET) film of 38 μm thick used as the support film. Each of photo-curable resin compositions of Examples 1 to 17 and Comparative Examples 1 to 5 was coated onto the support film. The coated film was passed through a hot air circulating oven (length 4 m) set at 100° C. over 5 minutes, forming a photo-curable resin layer on the support film. Using a laminating roll, a polyethylene film of 50 μm thick as the protective film was bonded to the photo-curable resin layer under a pressure of 1 MPa, yielding a photo-curable dry film. The thickness of photo-curable resin layer in Examples and Comparative Examples is tabulated in Table 1. The layer thickness was measured by an optical interference film thickness gauge.

From each of the photo-curable dry films of Examples and Comparative Examples, the protective film was stripped off. Using a vacuum laminator TEAM-100RF (Takatori Corp.) with a vacuum chamber set at a vacuum of 80 Pa, the photo-curable resin layer on the support film was closely bonded to a migration test substrate (comb-shaped electrode-bearing substrate, conductor: copper, conductor spacing and width: 20 μm, conductor thickness: 4 μm). The temperature was 110° C. After restoration of atmospheric pressure, the substrate was taken out of the laminator, and the support film was stripped off.

Then the photo-curable resin layer was prebaked on a hot plate at 130° C. for 5 minutes for enhancing adhesion to the substrate. Next, using a contact aligner exposure tool, the photo-curable resin layer was exposed to radiation of 405 nm through a mask in order to form line-and-pattern and contact hole pattern. The substrate was baked (PEB) on a hot plate at 120° C. for 5 minutes and cooled. This was followed by spray development in propylene glycol monomethyl ether acetate (PGMEA) for 300 seconds for forming a pattern of the resin layer. The patterned layer on the substrate was post-cured in an oven at 180° C. for 2 hours while the oven was purged with nitrogen.

The cross-sectional profile of the resulting contact hole pattern having a size of 100, 80, 60, 40 or 20 μm was observed under scanning electron microscope (SEM). The minimum hole pattern ensuring that the hole penetrated to the film bottom is threshold F. Using the cross-sectional photographs, the 80-μm contact hole pattern was evaluated whether or not it was perpendicular. A perpendicular pattern is rated excellent (⊚), a slightly reverse tapered profile is rated good (○), a reverse tapered profile is rated fair (Δ), and opening failure is rated reject (X).

In terms of resolution, the exposure dose (mJ/cm$^2$) ensuring that the line width and space width of a 100-μm line-and-space pattern are equal is reported as sensitivity in Table 2. The resin layer from which no pattern could be formed by using the contact aligner exposure tool and effecting exposure in a dose of 5,000 mJ/cm$^2$ is rated "NG" in the sensitivity column.

For the evaluation of electrical properties (dielectric breakdown strength), a plurality of photo-curable resin layers of photo-curable dry films were attached to a steel plate under normal pressure and heated in an oven at 180° C. for 2 hours to form a cured film of 0.2 mm thick. The cured film was tested by a breakdown tester TM-5031AM (Tamadensoku Co., Ltd.) to determine the dielectric breakdown strength of a cured coating of a photo-curable resin composition.

Table 1 shows the formulation of photo-curable resin compositions, and Table 2 shows the test results of photo-curable dry films of Examples and Comparative Examples.

TABLE 1

|  |  | Photo-curable resin composition | | | | | Resin layer thickness (μm) |
|---|---|---|---|---|---|---|---|
|  |  | Epoxy-containing polymer | PAG | Crosslinker | Basic compound | Solvent |  |
| Example | 1 | A-1<br>100 pbw | PAG-4<br>1 pbw | EP-2<br>10 pbw |  | cyclopentanone<br>55 pbw | 100.0 |
|  | 2 | A-2<br>100 pbw | PAG-4<br>1 pbw | EP-2<br>10 pbw |  | cyclopentanone<br>55 pbw | 99.8 |
|  | 3 | A-3<br>100 pbw | PAG-4<br>1 pbw | EP-2<br>10 pbw |  | cyclopentanone<br>55 pbw | 99.6 |
|  | 4 | A-4<br>100 pbw | PAG-4<br>1 pbw | EP-2<br>10 pbw |  | cyclopentanone<br>55 pbw | 101.0 |
|  | 5 | A-3<br>100 pbw | PAG-1<br>1 pbw | EP-2<br>10 pbw |  | cyclopentanone<br>55 pbw | 99.9 |
|  | 6 | A-3<br>100 pbw | PAG-2<br>1 pbw | EP-2<br>10 pbw |  | cyclopentanone<br>55 pbw | 99.5 |
|  | 7 | A-3<br>100 pbw | PAG-3<br>1 pbw | EP-2<br>10 pbw |  | cyclopentanone<br>55 pbw | 100.3 |
|  | 8 | A-3<br>100 pbw | PAG-4<br>1 pbw | EP-2<br>10 pbw | AM-1<br>0.2 pbw | cyclopentanone<br>55 pbw | 99.9 |
|  | 9 | A-3<br>100 pbw | PAG-4<br>1 pbw |  |  | cyclopentanone<br>55 pbw | 100.1 |
|  | 10 | A-4<br>100 pbw | PAG-4<br>1 pbw |  |  | cyclopentanone<br>55 pbw | 99.3 |
|  | 11 | A-3<br>100 pbw | PAG-4<br>1 pbw | EP-1<br>10 pbw |  | cyclopentanone<br>55 pbw | 99.5 |
|  | 12 | A-4<br>100 pbw | PAG-4<br>1 pbw |  | AM-1<br>0.2 pbw | cyclopentanone<br>55 pbw | 101.2 |
|  | 13 | A-4<br>100 pbw | PAG-4<br>2 pbw | EP-2<br>5 pbw | AM-1<br>0.4 pbw | cyclopentanone<br>55 pbw | 100.3 |
|  | 14 | A-3<br>100 pbw | PAG-4<br>0.5 pbw |  |  | cyclopentanone<br>55 pbw | 99.4 |
|  | 15 | A-3<br>100 pbw | PAG-4<br>4 pbw |  |  | cyclopentanone<br>55 pbw | 100.5 |
|  | 16 | A-1<br>100 pbw | PAG-4<br>1 pbw | EP-2<br>10 pbw |  | cyclopentanone<br>55 pbw | 120.3 |
|  | 17 | A-3<br>100 pbw | PAG-4<br>1 pbw | EP-2<br>10 pbw |  | cyclopentanone<br>55 pbw | 130.1 |
| Comparative Example | 1 | A-3<br>100 pbw | PAG-5<br>1 pbw | EP-2<br>10 pbw |  | cyclopentanone<br>55 pbw | 100.3 |

TABLE 1-continued

| | | Photo-curable resin composition | | | | Resin layer thickness (μm) |
|---|---|---|---|---|---|---|
| | | Epoxy-containing polymer | PAG | Crosslinker | Basic compound | Solvent | |
| 2 | A-3 100 pbw | PAG-6 1 pbw | EP-2 10 pbw | | cyclopentanone 55 pbw | 98.9 |
| 3 | A-4 100 pbw | PAG-5 1 pbw | EP-2 10 pbw | | cyclopentanone 55 pbw | 100.9 |
| 4 | B-1 100 pbw | PAG-5 1 pbw | EP-3 10 pbw | | cyclopentanone 55 pbw | 101.2 |
| 5 | EPON-SU8 100 pbw | PAG-4 2 pbw | | | cyclopentanone 55 pbw | 98.7 |

TABLE 2

| | | Electric properties Dielectric breakdown strength (V/μm) | Resolution | | Profile of contact hole pattern |
|---|---|---|---|---|---|
| | | | Sensitivity (mJ/cm²) | Threshold F (μm) | |
| Example | 1 | 550 | 456 | 60 | ○ |
| | 2 | 540 | 352 | 40 | ○ |
| | 3 | 570 | 335 | 20 | ○ |
| | 4 | 550 | 307 | 20 | ○ |
| | 5 | 420 | 1,700 | 80 | Δ |
| | 6 | 410 | 752 | 40 | ○ |
| | 7 | 505 | 522 | 20 | ○ |
| | 8 | 555 | 611 | 20 | ⊚ |
| | 9 | 465 | 387 | 20 | ○ |
| | 10 | 495 | 361 | 20 | ○ |
| | 11 | 570 | 655 | 40 | ○ |
| | 12 | 435 | 817 | 20 | ⊚ |
| | 13 | 520 | 274 | 20 | ⊚ |
| | 14 | 460 | 710 | 20 | ○ |
| | 15 | 480 | 110 | 40 | ○ |
| | 16 | 550 | 502 | 80 | ○ |
| | 17 | 520 | 340 | 40 | ⊚ |
| Comparative Example | 1 | film failure | NG | not resolved | X |
| | 2 | 320 | 2,400 | 80 | Δ |
| | 3 | film failure | NG | not resolved | X |
| | 4 | 420 | 5,000 | 100 | X |
| | 5 | 295 | NG | not resolved | X |

FIG. 1 is a set of SEM images in cross section of 100, 80, 60, 40 and 20-μm contact hole patterns in Example 10.

Japanese Patent Application No. 2012-125756 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photo-curable resin composition comprising
(A) an epoxy-containing polymer comprising recurring units of the general formula (1) and having a weight average molecular weight of 3,000 to 500,000,

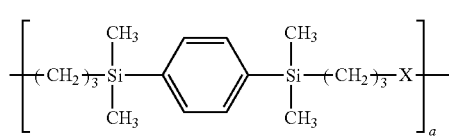

(1)

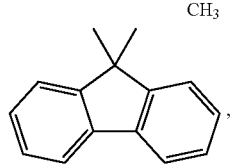

-continued $$\left[\begin{array}{c}R^1\\-(CH_2)_3-Si-\\R^2\end{array}\left(-O-\begin{array}{c}R^3\\Si-\\R^4\end{array}\right)_m-(CH_2)_3-X\right]_b$$

$$\left[\begin{array}{c}CH_3\\-(CH_2)_3-Si-\\CH_3\end{array}-\begin{array}{c}CH_3\\Si-(CH_2)_3-Y\\CH_3\end{array}\right]_c$$

$$\left[\begin{array}{c}R^1\\-(CH_2)_3-Si-\\R^2\end{array}\left(-O-\begin{array}{c}R^3\\Si-\\R^4\end{array}\right)_m-(CH_2)_3-Y\right]_d$$

wherein $R^1$ to $R^4$ are each independently a monovalent $C_1$-$C_8$ hydrocarbon group, m is an integer of 1 to 100, a, b, c and d each are 0 or a positive number, c and d are not equal to 0 at the same time, a+b+c+d=1, and 0<(c+d)/(a+b+c+d)≤1.0, X is a divalent organic group of the general formula (2), and Y is a divalent organic group of the general formula (3), (2)

$$\begin{array}{c}OH\\ \\ \end{array}\begin{array}{c}OH\\ \\ \end{array}$$
—〔⟨ ⟩〕—[Z]_n—〔⟨ ⟩〕—
$(R^5)_k$   $(R^6)_k$ wherein Z is a divalent organic group selected from the following:

$$-CH_2-,\quad -\begin{array}{c}CH_3\\|\\C\\|\\CH_3\end{array}-,\quad -\begin{array}{c}CF_3\\|\\C\\|\\CF_3\end{array}-\text{ and}$$

[fluorene group], n is 0 or 1, $R^5$ and $R^6$ are each independently a $C_1$-$C_4$ alkyl or alkoxy group, k is independently 0, 1 or 2,

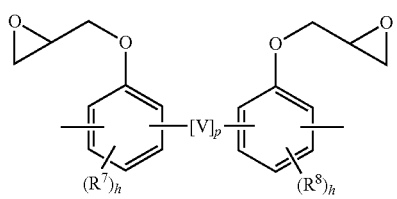
(3)
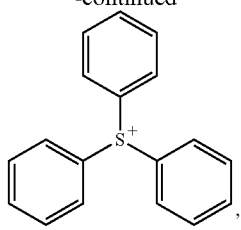
an onium salt of formula (4-3)
wherein V is a divalent organic group selected from the following:
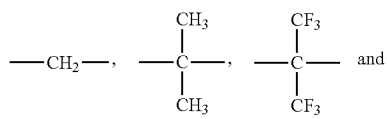
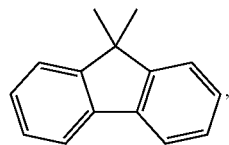
p is 0 or 1, $R^7$ and $R^8$ are each independently a $C_1$-$C_4$ alkyl or alkoxy group, and h is independently 0, 1 or 2,
(B) a photoacid generator selected from the group consisting of an onium salt of formula (4-2)
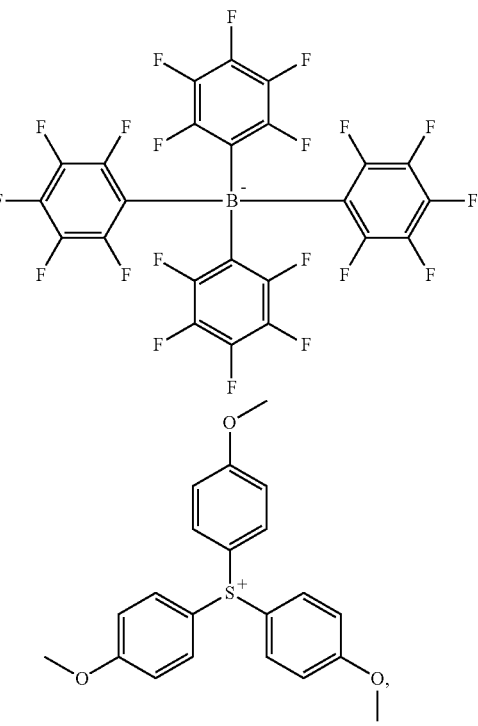
(4-3)
and an onium salt of formula (4-4)
(4-2)
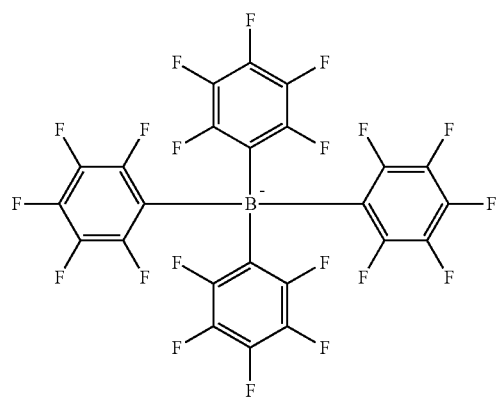
(4-4)
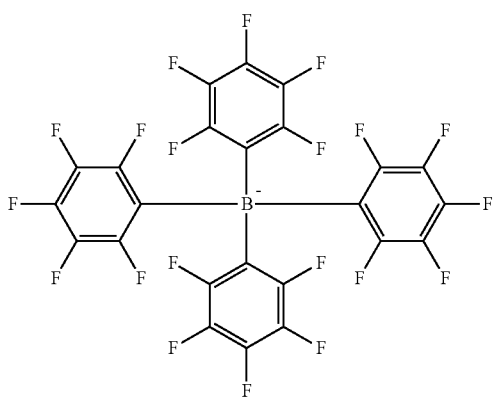

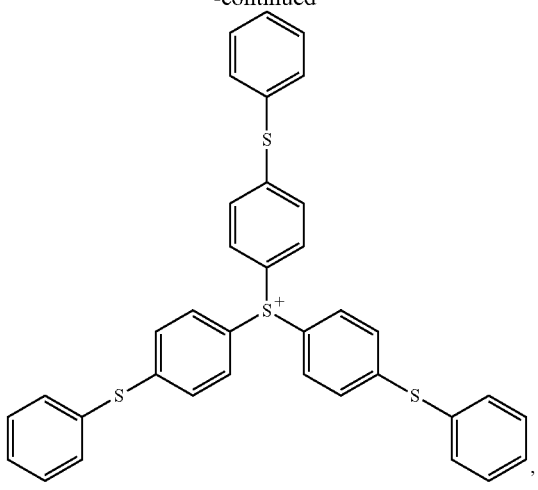

and (C) a solvent.

2. The composition of claim 1, further comprising (D) an epoxy compound containing on average at least two epoxy groups per molecule other than component (A) as crosslinker.

3. The composition of claim 1, further comprising (E) a basic compound.

4. The composition of claim 1 wherein the epoxy-containing polymer comprises units of formula (1) wherein $0<c/(a+b+c+d)\leq 0.7$.

5. The composition of claim 1 wherein the epoxy-containing polymer comprises units of formula (1) wherein $0<d/(a+b+c+d)\leq 0.7$.

6. The composition of claim 1 wherein the photoacid generator of formula (4) has the following structural formula (4-4)

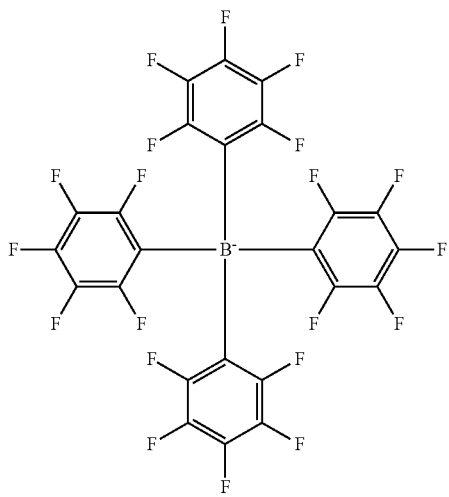

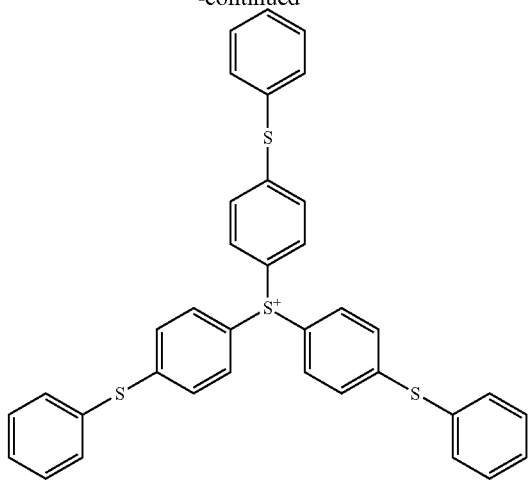 [SMILES: c1ccc(Sc2ccc([S+](c3ccc(Sc4ccccc4)cc3)c3ccc(Sc4ccccc4)cc3)cc2)cc1]

7. A photo-curable dry film obtained by coating and drying the photo-curable resin composition of claim 1 to a support film.

8. A pattern forming process comprising the steps of:
   (i) applying the photo-curable resin composition of claim 1 to a substrate to form a photo-curable resin layer thereon,
   (ii) exposing the photo-curable resin layer to radiation of wavelength 190 to 500 nm through a photomask, and
   (iii) baking the exposed resin layer and developing it in a developer.

9. The process of claim 8, further comprising the step (iv) of post-curing the patterned resin layer at a temperature of 100 to 250° C.

10. A film for the protection of electric and electronic parts, which is the cured layer obtained by the process of claim 8.

11. An electric or electronic part comprising the protective film of claim 10.

12. A pattern forming process comprising the steps of:
    (i) applying the photo-curable dry film of claim 7 to a substrate to form a photo-curable resin layer thereon,
    (ii) exposing the photo-curable resin layer to radiation of wavelength 190 to 500 nm through a photomask, and
    (iii) baking the exposed resin layer and developing it in a developer.

13. The process of claim 12, further comprising the step (iv) of post-curing the patterned resin layer at a temperature of 100 to 250° C.

14. A film for the protection of electric and electronic parts, which is the cured layer obtained by the process of claim 12.

15. An electric or electronic part comprising the protective film of claim 14.

* * * * *